United States Patent
Moriya

Patent Number: 5,534,209
Date of Patent: Jul. 9, 1996

[54] METHOD FOR MANUFACTURING A LIQUID CRYSTAL POLYMER FILM AND A LIQUID CRYSTAL POLYMER FILM MADE THEREBY

[75] Inventor: Akira Moriya, Okayama, Japan

[73] Assignee: Japan Gore-Tex, Inc., Japan

[21] Appl. No.: 403,516

[22] Filed: Mar. 13, 1995

[30] Foreign Application Priority Data

Mar. 15, 1994 [JP] Japan .................................. 6-68922

[51] Int. Cl.⁶ ........................................... B29C 43/24
[52] U.S. Cl. ......................... 264/171.13; 264/175; 428/1
[58] Field of Search ..................... 264/171.13, 172.19, 264/173.1, 175; 428/1

[56] References Cited

U.S. PATENT DOCUMENTS

| | | |
|---|---|---|
| 3,953,566 | 4/1976 | Gore . |
| 3,962,153 | 6/1976 | Gore . |
| 4,096,227 | 6/1978 | Gore . |
| 4,187,390 | 2/1980 | Gore . |
| 4,802,061 | 1/1989 | Portugall et al. ............. 361/400 |
| 4,923,660 | 5/1990 | Willenberg et al. .......... 264/103 |
| 4,956,140 | 9/1990 | Rolles et al. .................. 264/175 |
| 5,039,208 | 8/1991 | Ohnishi et al. . |
| 5,186,960 | 2/1993 | Walsh, Jr. . |
| 5,238,523 | 8/1993 | Yuasa et al. . |
| 5,384,168 | 1/1995 | Dubal et al. . |

FOREIGN PATENT DOCUMENTS

| | | |
|---|---|---|
| 137449 | 4/1985 | European Pat. Off. ........ 264/175 |
| 0484818 | 5/1992 | European Pat. Off. . |
| 0512397 | 11/1992 | European Pat. Off. . |
| 0612610 | 8/1994 | European Pat. Off. . |
| 60-172306 | 9/1985 | Japan . |
| 63-031729 | 2/1988 | Japan . |
| 1-130390 | 5/1989 | Japan . |
| 2-089617 | 3/1990 | Japan . |
| 2-089616 | 3/1990 | Japan . |
| 2-178016 | 7/1990 | Japan . |
| 2-175737 | 7/1990 | Japan . |
| 02-203321 | 10/1990 | Japan . |
| 3-152131 | 6/1991 | Japan . |
| 4-62144 | 2/1992 | Japan ............................ 264/175 |
| 4-166309 | 6/1992 | Japan . |
| 4-308737 | 10/1992 | Japan . |
| 5-043664 | 2/1993 | Japan . |
| 2166685 | 5/1986 | United Kingdom . |

*Primary Examiner*—Catherine Timm
*Attorney, Agent, or Firm*—Gary A. Samuels

[57] ABSTRACT

The invention is for a process to manufacture liquid crystal polymer films having balanced physical properties. The process includes feeding an oriented liquid crystal polymer material into a melt region formed between support membranes passing over the surface of and through an opening between heated rolls. The orientation of the liquid crystal polymer material is randomized and passed through the opening with the support membranes to form a laminated sandwich structure consisting of an unoriented liquid crystal polymer film between the support membranes. In another embodiment of the invention laminated sandwich structure is stretched to impart multiaxial orientation to the liquid crystal polymer film. The support membranes can be optionally removed to produce a film having a desirable surface finish.

12 Claims, 2 Drawing Sheets

METHOD FOR MANUFACTURING A LIQUID CRYSTAL POLYMER FILM AND A LIQUID CRYSTAL POLYMER FILM MADE THEREBY

FIELD OF THE INVENTION

The invention relates to a method for making films of high molecular weight liquid crystal polymers and to liquid crystal polymer (LCP) films made according to the method.

BACKGROUND OF THE INVENTION

Liquid crystal polymers are a family of materials that exhibit a highly ordered structure in the melt, solution, and solid states. They can be broadly classified into two types; lyotropic, having liquid crystal properties in the solution state, and thermotropic, having liquid crystal properties in the melted state.

Most liquid crystal polymers exhibit excellent physical properties such as high strength, good heat resistance, low coefficient of thermal expansion, good electrical insulation characteristics, low moisture absorption, and are good barriers to gas flow. Such properties make them useful in a broad range of applications in the form of fibers, injection molded articles, and, in sheet form, as electronic materials for printed circuit boards, packaging, and the like.

Many of the physical properties of liquid crystal polymers are very sensitive to the direction of orientation of the liquid crystal regions in the polymer. The ordered structure of the liquid crystal polymer is easily oriented by shear forces occurring during processing and highly aligned liquid crystal chains can be developed that are retained in the solid state, and result in highly anisotropic properties. This can be highly desirable for certain products, for example, in filaments, fibers, yarns, and the like. Anisotropic properties are often not desirable, however, in products having planar forms, such as tape, films, sheet, and the like.

A number of methods are used to produce liquid crystal polymer materials in planar forms that have more balanced, less anisotropic properties. These include the use of multilayer flat extrusion dies which are fashioned such that they extrude overlapping layers at intersecting angles, use of static mixer-agitators at the die inlets, and the like. More recently, dies having rotating or counter-rotating surfaces have become known in the art and successfully used. These extrusion techniques, used separately or in combination with other methods known in the art, such as film blowing, can produce liquid crystal polymer film and sheet that are multiaxially oriented, that is, oriented in more than one direction, and have more balanced physical properties.

A characteristic of these methods is that locally, for example, at the surfaces of the sheet or film, the molecules are oriented in the planar x-y directions by shear imparted at the extrusion surfaces. In the z-direction, i.e., throughout the thickness, the x-y orientation of the molecules will change progressively from the orientation at one surface to the orientation at the other surface of the planar form. A drawback to these methods is that when attempting to make very thin multiaxially oriented films, e.g., films having a thickness of 25 micrometers or less, the forces imparted in the orientation transition region of the liquid crystal polymer by the extrusion surfaces are exerted in increasingly opposing directions as the distance between the extrusion surfaces diminishes and the formation of pinholes, tears, and other imperfections in the film takes place.

Additionally, and particulary in the case of melt-processed thermotropic liquid crystal polymers which have very high processing viscosity, it is difficult to obtain films with uniform surface smoothness and thickness by the processes described above. Problems such as film curling, streaking, and tear sensitivity have been associated with surface roughness and irregularities or nonuniform thickness in the films.

SUMMARY OF THE INVENTION

This invention provides a method for making a liquid crystal polymer film in which the liquid crystal polymers are randomly or, alternatively, multiaxially oriented; and which can produce a film having remarkably uniform surface finish and thickness. Furthermore, the films thus produced are strong, have balanced physical properties in at least the machine and transverse directions, and are free of tendencies to curl or surface peel.

The method comprises the steps of:

(a) feeding a thermotropic liquid crystal polymer material into a melt region formed between opposed inward-facing surfaces of two support membranes, each support membrane, in the melt region, having an outward-facing surface in contact with the surface of a heated roll, the heated rolls spaced apart to form an opening between the rolls and a gap between the support membranes passing over the rolls;

(b) heating and maintaining the liquid crystal polymer material at a temperature at or above its melt point and accumulating sufficient liquid crystal polymer material in the melt region above the gap to form a reservoir of melted liquid crystal polymer material wherein the liquid crystal polymer material becomes randomly oriented;

(c) passing the support membranes and liquid crystal polymer material through the opening between the rolls to form a sandwich structure comprising a liquid crystal polymer film between the support membranes, the width of the opening adjusted to preserve the random orientation of the liquid crystal polymer material forming the liquid crystal polymer film;

(d) solidifying the liquid crystal polymer film.

Another embodiment of the invention comprises the method described above and further comprises the step of stretching the sandwich structure in at least one direction, at a temperature at or above the melt point of the liquid crystal polymer, thereby imparting orientation to the liquid crystal polymer film.

Yet another embodiment of the invention comprises either of the methods above and further comprises the step of removing the support membrane from one or both surfaces of the liquid crystal polymer film.

It is recognized that "membrane" and "film" can often be used interchangeably, however, to avoid confusion, "membrane" will generally be used herein with respect to the porous support material; and "film" with respect to liquid crystal polymer material.

Liquid crystal polymer, as used herein, is meant to include polymer alloys having a liquid crystal polymer component as well as liquid crystal polymers alone. For convenience, the term "liquid crystal polymer" is used herein to include material of both kinds.

By multiaxially oriented liquid crystal polymer, as used herein, is meant liquid crystal polymer material to which forces in more than one direction have been applied in order to orient the liquid crystal polymer.

By porous as used herein is meant a structure of interconnected pores or voids such that continuous passages and pathways throughout a material are provided.

Longitudinal direction, x-direction, and machine direction (MD) as used herein indicates the planar direction of manufacture of a film or sheet; transverse direction (TD) and y-direction indicate the planar direction normal to the direction of manufacture.

DETAILED DESCRIPTION OF THE INVENTION

With reference to the drawings, the process of the invention will be described in detail.

Figure 1:
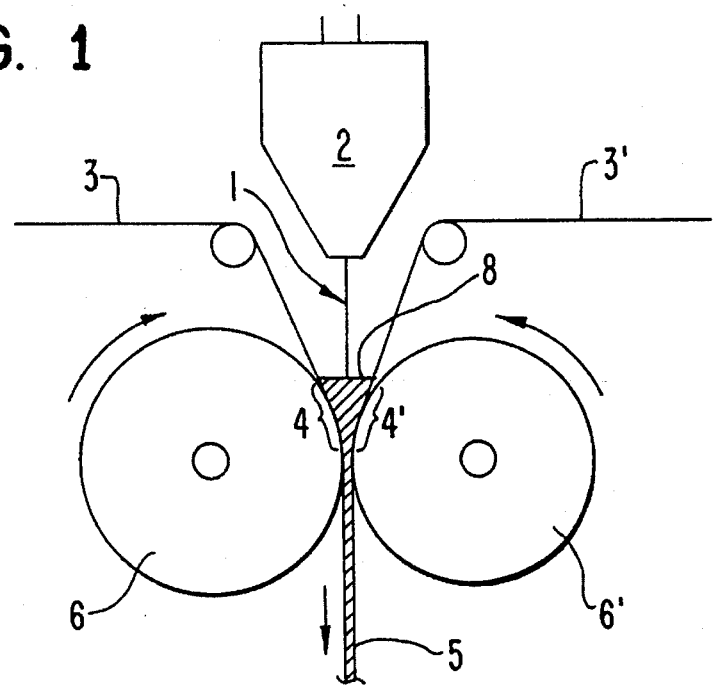
FIG. 1 is a schematic drawing of an embodiment of the invention.

In FIG. 1 is shown a thermotropic liquid crystal polymer material 1 being fed from an extruder 2 into a melt region 4,4' formed between support membranes 3,3' where the support membranes pass over the surface of heated rolls 6,6'. The liquid crystal polymer 1 is fed at a rate sufficient to create and maintain the level of a reservoir 8, or puddle, of melted liquid crystal polymer in the melt region 4,4' above the nip of the heated rolls 6,6'. By "nip" is meant the location of minimum distance between the roll surfaces. The width of the opening at the nip is adjusted so that support membranes 3,3' and a portion of the liquid crystal polymer 1 in the reservoir 8 are brought together and adhered to form a sandwich structure 5 consisting of a liquid crystal polymer film between the support membranes. The sandwich structure 5 can then, optionally, be cooled to solidify the liquid crystal polymer film by conventional means (not shown) such as passage over a chill roll, air-cooled, or the like, and taken up.

Another embodiment of the process is a step in which one or both support membranes is removed from the surface of the sandwich structure 5. One or both of the support membranes can be removed or peeled from the sandwich structure by conventional web-handling means, including removal by hand. Therefore, the process step depicted in FIG. 2 is exemplary only and is intended to be not limiting.

Figure 2:
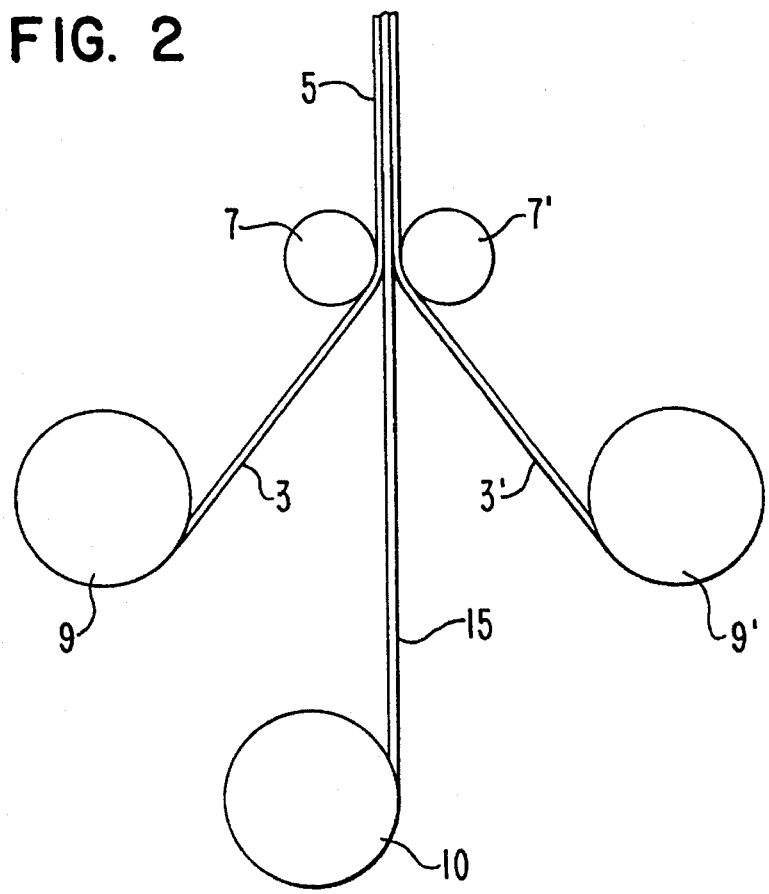
FIG. 2 is a schematic drawing of another embodiment of the invention.

In FIG. 2 is shown a step in which both support membranes are removed from the sandwich structure. As shown in FIG. 2, the sandwich structure 5 comprising a solidified liquid crystal polymer film is passed between peel rolls 7,7'. The support membranes 3,3' are peeled from the surfaces of the sandwich structure 5 as they exit the nip of the peel rolls and are collected on support membrane take-up rolls 9,9'. The now unsupported free-standing liquid crystal polymer film 15 is collected on main take-up roll 10.

Materials for the support membrane of the invention are selected on the basis of their ability to withstand the forces and temperatures of processing, on their ability to be stretched, and on their chemical resistance to the liquid crystal polymers and solutions with which they are combined. The support membrane is preferably made of a synthetic polymer and may be porous or nonporous.

Suitable synthetic polymers for nonporous support membranes include thermoplastic polyimides, polyethersulfones, polyethylene terephthalates, and the like. Such membranes are well known in the art, and are commercially available from many sources. The nonporous support membranes should be in the range 10 to 500 micrometers thick, preferably 50 to 200 micrometers thick.

Porous sheets or membranes of synthetic polymers, for example, polyethylene, polypropylene, or other polyolefins; polyesters, polycarbonates, polystyrenes, polyvinyl chloride, or fluoropolymers, and the like, can also be used as support membranes. Porous support membranes should have an average pore size in the range 0.05 to 5.0 micrometers, preferably 0.2 to 1.0 micrometers; a pore volume in the range 40 to 95 percent, preferably 60 to 85 percent; and a thickness in the range 5 to 300 micrometers, preferably 20 to 150 micrometers. Fluoropolymers, including tetrafluoroethylene/(perfluoroalkyl) vinyl ether copolymer (PFA), tetrafluoroethylene/hexafluoropropylene copolymer (FEP), and polytetrafluoroethylene (PTFE), and the like, are preferred for their processing characteristics, temperature resistance, and chemical inertness. Most preferred are porous membranes of polytetrafluoroethylene.

Suitable porous polytetrafluoroethylene membranes can be made by processes known in the art, for example, by papermaking processes, or by processes in which filler materials are incorporated with the PTFE resin and are subsequently removed to leave a porous structure. Preferably the porous polytetrafluoroethylene membrane is porous expanded polytetrafluoroethylene membrane having a structure of interconnected nodes and fibrils, as described in U.S. Pat. Nos. 3,953,566, 3,962,153, 4,096,227, and 4,187,390 which fully describe the preferred material and processes for making them.

Thermotropic liquid crystal polymers, because of their melt processibility, are preferred as the liquid crystal polymer of the invention. Virtually any kind of thermotropic liquid crystal polymer material can be made into a film by the method of the invention, and selection of a suitable liquid crystal polymer material is based on the end use projected for the film. The method is particularly well suited for processing high molecular weight high melt point thermotropic liquid crystal polymers, especially those having a melt point of 200° C. or higher. Suitable thermotropic liquid crystal polymers include aromatic polyesters which exhibit liquid crystal properties when melted and which are synthesized from aromatic diols, aromatic carboxylic acids, hydroxycarboxylic acids, and other like monomers. Typical examples include a first type consisting of parahydroxybenzoic acid (PHB), terephthalic acid, and biphenol; a second type consisting of PHB and 2,6-hydroxynaphthoic acid; and a third type consisting of PHB, terephthalic acid, and ethylene glycol. They are represented below as Formulas 1, 2, and 3 respectively.

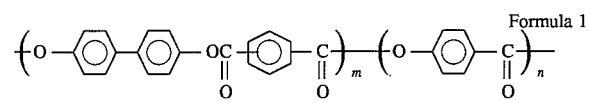

Formula 1

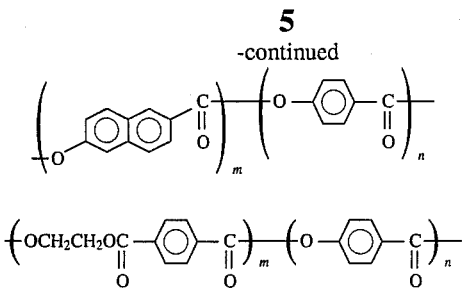

Formula 2

Formula 3

Also, in the present invention, a polymer alloy having a liquid crystal polymer component can be used. In such cases the polymer which is mixed with or chemically bonded to a liquid crystal polymer can be selected from the group consisting of, but not limited to, polyetheretherketones, polyether sulfones, polyimides, polyamides, polyacrylates, and the like. The polymers and liquid crystal polymer components are mixed in a weight ratio of 10:90 to 90:10, preferably in the range of 30:70 to 30:70.

The liquid crystal polymers and polymer alloys described hereinabove are meant for illustration and not for limitation of the invention. It is recognized by the inventor that many other liquid crystal polymers and polymer alloys suitable for use in the invention are known in the art. Likewise, it is recognized that compatibilizers, plasticizers, flame retardant agents, and other additives may be included with the liquid crystal polymers.

Referring now to FIG. 1, a melt region 4,4' is formed between the inward facing surfaces of support membranes 3,3' where the support membranes pass over and contact the curved surfaces of the upper facing quadrants of heated calender rolls 6,6'. The rolls are disposed so that their axes are parallel and horizontal and, therefore, the distance between the rotating curved surfaces of the rolls, measured progressively from the top to the bottom of the upper facing quadrants, continuously diminishes until the nip, or minimum distance, between the surfaces at the bottom of the upper facing quadrants is reached. The curved surfaces are thus disposed to provide in the melt region an upward-facing chamber, roughly V-shaped in cross-section, having a lower minimum opening dimension defined by the width of the opening at the nip and an upper maximum opening dimension much larger than the minimum dimension. Other types of heating surfaces can also be used, for example, angled flat platens or platens having curved surfaces, so long as they are arranged to provide the features described above, however, rolls are preferred for their availability and ease of use.

Again referring to FIG. 1, a thermotropic liquid crystal polymer material 1 is fed from an extruder 2, for example, through a conventional T-die, into the melt region 4,4'. The liquid crystal polymer material 1 arrives in melted form and is oriented in the machine direction by shear imparted by the die. The liquid crystal polymer material is initially fed at a rate such that a puddle of melted liquid crystal polymer material to form a reservoir 8 is accumulated above the gap between the support membranes 3,3' passing over the surfaces and through the nip of heated rolls 6,6'. The reservoir 8 formed above the nip of the heated rolls has a capacity sufficient to contain a much greater volume of melted liquid crystal polymer than instantaneously passes through the nip. When a sufficient amount of melted liquid crystal polymer material has been accumulated in the reservoir, the process rates are adjusted by decreasing the material feed rate or increasing roll speed so that the amount of melted liquid crystal polymer material contained in the reservoir is kept essentially constant. An alternative feed method is to introduce the liquid crystal polymer material 1 into the melt region 4,4' as a solid oriented film, fiber, rod, or the like. In this case, the liquid crystal polymer material is initially melted in the melt region, although it may be preheated to facilitate melting.

The heated rolls are heated to a temperature sufficient to maintain the thermotropic liquid crystal polymer material in the melt region at least at a temperature at or above the melt point of the liquid crystal polymer, typically the temperature of the liquid crystal polymer material in the melt region will be in the range 10° to 50° C. or more above the melt point of the liquid crystal polymer. Preferably the liquid crystal polymer, which enters the top of the reservoir in the melt region in an oriented state, is heated to a temperature which lowers the viscosity of the melted material and permits it to become randomly oriented. The purpose for the reservoir of melted liquid crystal polymer material is to provide a place and sufficient residence time at temperature for the material to relax from its oriented feed state, in which the liquid crystal polymers are aligned substantially in one direction, to a random unoriented state before the material and support membranes are passed through the nip of the heated rolls to form a laminated sandwich structure.

The randomly oriented liquid crystal polymer material and support membranes 3,3' are passed from the melt region 4,4' through the opening at the nip of heated rolls 6,6' to form the laminated structure 5. The width of the opening at the nip and the compressive forces applied to the support membranes are adjusted to minimize disturbance of the random orientation of the liquid crystal polymer material. Only light compressive force is used in order to prevent movement of the liquid crystal polymer material independent of the support membrane. The bond strength between the liquid crystal polymer material and the support membranes is influenced by the adhesive affinity the materials have for each other, and some experimentation may be required to select appropriate material combinations. In the case of porous support membranes bonding is facilitated by mechanical interlocking of the liquid crystal polymer material with the pore structure of the support membranes. This mechanical interlocking is particularly important when using porous fluoropolymer support membranes as fluoropolymers are well known for their release properties. However, by selection of the materials and properties of porous support membranes, for example pore size and pore volume; and by controlling process variables such as the temperature and viscosity of the material in the melt region, process speed, and the like, which influence the depth of penetration of the liquid crystal polymer material into the porous support membrane, bonding can be readily achieved and bond strength easily controlled.

The support membranes 3,3' move through the nip at the same rate as the liquid crystal polymer material and impart no shear forces to the liquid crystal polymer material adhering to and forming a film between them. The gap between the support membranes 3,3' is sufficiently wide that, as much as possible, the velocity of the liquid crystal polymer material exiting the melt region is kept uniform and virtually no shear is imparted to the liquid crystal polymer material, thus preserving the random orientation of the liquid crystal polymer film of the laminated sandwich structure 5. The laminated sandwich structure 5 can then be cooled to solidify the liquid crystal polymer film by conventional means, such as passage over chill rolls, forced air cooling, or the like, and taken up. The liquid crystal polymer film thus produced is an essentially unoriented film having balanced physical properties, at least in the planar x-y directions, and having remarkably uniform thickness.

Figure 3:
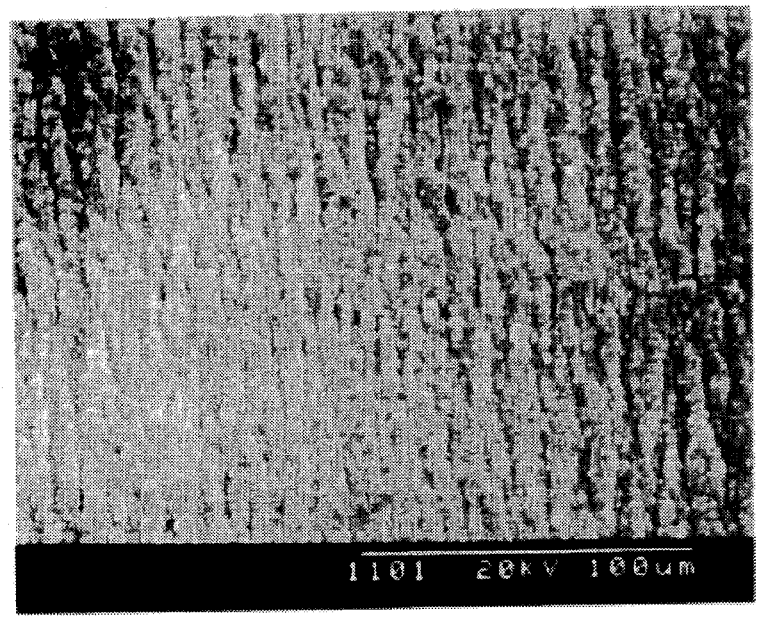
FIG. 3 is a photomicrograph (400×magnification) of a portion of the surface of a liquid crystal polymer film made according to Example 5.
Figure 4:
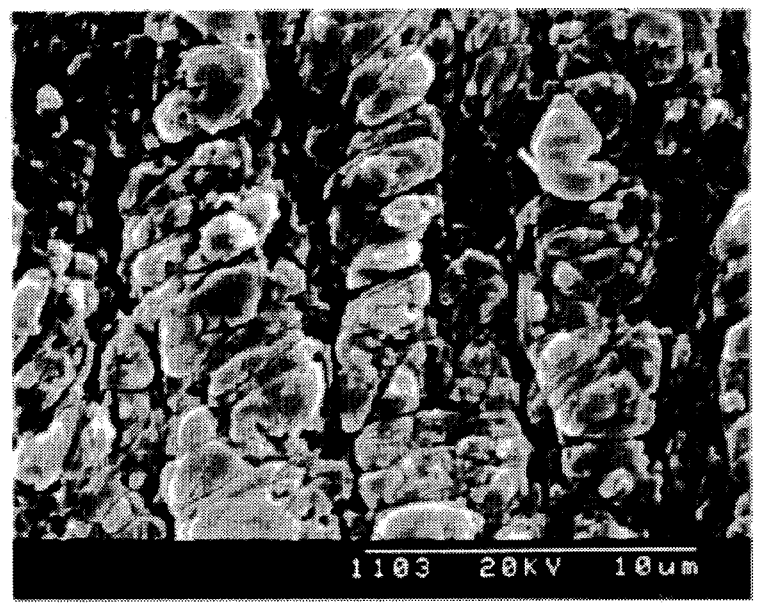
FIG. 4 is a photomicrograph (4000×magnification) of a portion of the surface of a liquid crystal polymer film shown in FIG. 3.

In another embodiment of the invention a step is added to the process described above in which one or both support membranes 3,3' can be removed from the surface of the laminated sandwich structure 5. An example of this step is shown in FIG. 2 which depicts peeling and removing both support membranes from the laminated sandwich structure to produce a free-standing liquid crystal polymer film having the properties described above. It has been discovered that peeling the support membranes from the liquid crystal polymer film can produce a microscopic texture on the film surface. Again, by selection of the materials and properties of the support membranes, for example pore size and pore volume of porous support membranes; and by controlling process variables which also influence the support membrane-to liquid-crystal-polymer bonding characteristics such as melt temperature, viscosity, process speed, and the like, the microscopic texturizing of the film surface can be controlled to produce a uniform surface finish in the range 0.05 to 5 micrometers, i.e., from very smooth to a microscopic roughness, which is very useful for improving surface related properties in the liquid crystal polymer film, for example, increased surface area for bonding by adhesives, metal-plating properties, and the like. An example of such microscopic texturizing obtained using a porous expanded polytetrafluoroethylene membrane having a nominal pore size of 1.0 micrometers and a pore volume of about 80% is shown in the photomicrographs of FIGS. 3 and 4.

When no additional melting steps are required to produce a liquid crystal polymer film for an end-use application, it is desirable to heat treat the film to stabilize dimensional and physical properties, and reduce strains in the liquid crystal polymer film. The heat treatment can be done at any time after the liquid crystal polymer film has been solidified, and with or without the support membranes in place. The heat treatment is done with the material restrained to prevent shrinking. Heat treatment temperature will vary according to the thermotropic liquid crystal polymer used, but is generally in the range from slightly above the glass transition temperature (Tg) to slightly below the melt range of the liquid crystal polymer.

In yet another embodiment of the invention a stretching step is included in the process, in which the laminated sandwich structure 5 produced by the process described hereinabove is stretched in at least one direction, preferably in at least two directions, to impart multiaxial orientation to the unoriented liquid crystal polymer film. An advantage obtained by using the laminated sandwich structure comprising an unoriented liquid crystal polymer film, produced as described above, as the starting material for the stretching step, is that orientation of the liquid crystal polymer material ordinarily developed in steps prior to stretching, such as extrusion, blowing, or calendering steps, need not be accommodated or compensated for, as is the case with conventional processes used to develop balanced properties in stretched liquid crystal polymer films.

In the stretching step the laminated sandwich structure 5 formed of the thermotropic liquid crystal polymer film and porous support membrane is heated to a temperature at or above the melt point of the liquid crystal polymer and, preferably stretched in at least two directions. Stretching in at least two directions may be done simultaneously or sequentially, and may be done in one or more steps. The amount of stretch, relative to original planar x-y directions or radial directions, is ordinarily in the range 1.5 to 15:1, preferably in the range 4 to 8:1. The rate of stretch is generally in the range 5% to 500% per minute, preferably in the range 20% to 100% per minute; at a speed in the range 0.2 to 10 meters/minute, preferably in the range 1 to 6 meters/minute.

Stretching may be done using conventional equipment or apparatus known in the art. For example, multiaxial simultaneous stretching can be done using a radial stretching pantograph; and biaxial stretching in the planar x-y directions can be done, simultaneously or sequentially, using an x-y direction stretching pantograph. Also, equipment having sequential uniaxial stretching sections can be used, for example, a machine having a section containing differential speed rolls for stretching in the machine direction (MD), and a tenter frame section for stretching in the transverse direction (TD).

As the laminated sandwich structure is stretched in the planar x-y directions the area of its surface progressively increases and its thickness is progressively reduced. The melted liquid crystal polymer film, bonded to and supported by the porous support membrane, is also stretched by the stretching membrane, also increases in area in the planar x-y directions, and the liquid crystal polymers of the film become oriented by the stretching. At the same time, as there is no change in the volume of liquid crystal polymer, the liquid crystal polymer film becomes progressively thinner as the material of the film is dragged and spread by the stretching membrane.

By controlling the amount of stretch, rate of stretch and directions of stretch of the laminated sandwich structure, the liquid crystal polymers can be aligned in a preferred orientation, or aligned multiaxially and more randomly to provide high strength films having relatively balanced physical properties in the planar x-y directions. In general, liquid crystal polymer films having balanced physical properties are more useful, particularly for electronic applications such as printed circuit boards, and are preferred. By controlling the amount of liquid crystal polymer present in the laminated sandwich structure forming the starting material of the stretching step, i.e., by using thicker or thinner starting films, and adjusting the amount of stretch to provide the desired increase in planar surface area, the thickness of the liquid crystal polymer film can be reduced to 25 micrometers or less, and can be as thin as 2 micrometers. Furthermore, the liquid crystal polymer film or layer remains intact, does not have holes or tears, and has a very uniform thickness.

After the stretching step the laminate sandwich structure should also be heat treated to stabilize dimensional and physical properties, and reduce strains in the liquid crystal polymer film. The heat treatment is done with the material restrained to prevent shrinking. Heat treatment temperature will vary according to the thermotropic liquid crystal polymer used, but is generally in the range from slightly above the glass transition temperature (Tg) to slightly below the melt range of the liquid crystal polymer.

The support membranes can also be removed from one or both surfaces of the stretched laminated sandwich structure to produce a very thin free-standing liquid crystal polymer film with excellent surface finishes, as described earlier.

The free-standing liquid crystal polymer films and laminated sandwich structures made by the process of the invention provide relatively balanced physical properties, are thin and light in weight and, furthermore, have strength, flexibility, thermal expansion, and liquid and gas barrier characteristics that make them highly desirable for use as printed circuit board and other electronic substrates, and the like.

TEST DESCRIPTIONS

Tensile Test

Tensile strength and tensile elongation were measured in accordance with Japanese Industrial Standard JIS K 7127.

Measurement values are given in kg/mm$^2$, and are shown in Table 1.

Surface Roughness

Surface roughness was measured by a profilometer, Model SURFCOM 570A or Model SURFCOM 1500A, made by Tokyo Seimitsu Co.

Roughness units, Ra, are given in micrometers and, in accordance with Japanese Industry Standard JIS B0601, represent the arithmetic mean of the absolute value of the deviation from the center line.

Surface Layer Separation

The sample surface is softly rubbed with sandpaper and examined visually to determine if fibers have been created or raised from the surface. The results are reported simply as "yes" (fibers present) or "no" (no fibers present).

EXAMPLE 1

As shown in FIG. 1, two support membranes of porous expanded polytetrafluoroethylene were strung over the surface and through the nip of a pair of horizontally-mounted heated metal rolls. The porous expanded polytetrafluoroethylene membranes had a nominal pore size of 0.2 micrometers, a pore volume of 80%, and was 40 micrometers thick.

The heated calender rolls had a working surface of 20 mm diameter and 600 mm length. The nip opening between the rolls was set at 250 micrometers and the surface temperature of the rolls was 320° C.

A thermotropic liquid crystal polymer (Vectra® A-950, supplied by Polyplastics Co.) was melt-extruded directly into a melt region between the support membranes to form a puddle of melted liquid crystal polymer material above the nip opening. A conventional uniaxial screw extruder (screw diameter: 50 mm) and T-die was used. The T-die had a lip length of 500 mm; lip clearance of 1 mm; and was operated at a temperature of 300° C.

The support membrane and liquid crystal polymer material were laminated to form a sandwich structure by passage through the nip between the rolls at a speed of about 2 meters/minute, and at an applied pressure of about 3 kg/cm. The laminated sandwich structure was then passed over 50 mm diameter cooling rolls, operated at a temperature of 150° C., to solidify the liquid crystal polymer film formed between the support membranes, and taken up on a roll. A portion of the roll of the laminated sandwich structure was heat treated at a temperature of 240° C. for 10 minutes, after which the porous polytetrafluoroethylene support membranes were peeled off, and the free-standing liquid crystal polymer film was spooled up.

A liquid crystal polymer film having a thickness of 230 micrometers was produced.

The liquid crystal polymer film was examined and found to not have tears or holes, and there was no evidence of surface layer separation. Samples were prepared for tensile tests. Test results are shown in Table 1.

EXAMPLE 2

As described in Example 1, two support membranes of porous expanded polytetrafluoroethylene were strung over the surface and through the nip of a pair of horizontally-mounted heated metal rolls. The porous expanded polytetrafluoroethylene membranes had a nominal pore size of 0.2 micrometers, a pore volume of 80%, and was 40 micrometers thick.

The heated calender rolls had a working surface of 20 mm diameter and 600 mm length. The nip opening between the rolls was set at 250 micrometers and the surface temperature of the rolls was 320° C.

A sheet of thermotropic liquid crystal polymer (Vectra® A-950, supplied by Polyplastics Co.) was melt-extruded, cooled and solidified on cooling rolls, and taken up. A conventional uniaxial screw extruder (screw diameter: 50 mm) and T-die was used. The T-die had a lip length of 500 mm; lip clearance: of 1 mm; and was operated at a temperature of 300° C.

The sheet of liquid crystal polymer thus produced had a poor balance of physical properties in the machine direction and transverse direction, and it had tears at several locations in the machine direction. The sheet of solid liquid crystal polymer, in lieu of the molten extruded liquid crystal polymer described in Example 1, was fed into the melt region between the heated metal rolls, melted to form a puddle above the nip opening, and further processed as described in Example 1.

A liquid crystal polymer film having a thickness of 230 micrometers was produced.

The liquid crystal polymer film was examined and found to not have tears or holes, and there was no evidence of surface layer separation. Samples were prepared for tensile tests. Test results are shown in Table 1.

EXAMPLE 3

A portion which was not heat treated of the roll of the laminated sandwich structure described in Example 1 was sequentially stretched biaxially in a stretching apparatus having a first section of differential speed rolls for machine direction stretching, and a tenter frame section for transverse direction stretching. The stretching zone was operated at 295° C. The laminated sandwich structure was stretched an amount of 3:1 in each direction, at a stretch rate of 100% per minute. The stretched laminated sandwich structure was cooled to solidify the liquid crystal polymer, and the material heat treated at 240° C. for 10 minutes. The support membranes were then peeled off, and the free-standing liquid crystal polymer film spooled up.

A liquid crystal polymer film having a thickness of 25 micrometers was produced.

The liquid crystal polymer film was examined and found to not have tears or holes, and there was no evidence of surface layer separation. Samples were prepared for tensile tests. Test results are shown in Table 1.

EXAMPLE 4

A laminated sandwich structure was made as described in Example 3, except that the amount of stretch was 9:1 in each direction, and the support membranes were not removed after heat treatment.

A laminated sandwich structure having a liquid crystal polymer film layer 3 micrometers thick was produced.

The liquid crystal polymer film was examined and found to not have tears or holes, and there was no evidence of surface layer separation. Samples were prepared for tensile tests. Test results are shown in Table 1.

Comparative Example 1

A thermotropic liquid crystal polymer (Vectra® A-950 resin, supplied by Polyplastics Co.) was extruded and blown at a ratio of 1.2:1 to form a film. A 50 mm diameter uniaxial screw extruder with a rotating die (Type 304 SS) having a 100 mm orifice was used. Extrusion conditions were: die rotation rate-7 RPM; die temperature-300° C., The film was cooled by forced air, heat treated at 240° C. for 10 minutes, and taken up.

A liquid crystal polymer film having a thickness of 25 micrometers was produced.

The liquid crystal polymer film was examined and found to not have tears or holes, however, it was noted that surface layer separation had taken place. Samples were prepared for tensile tests. Test results are shown in Table 1.

Comparative Example 2

A liquid crystal polymer film was prepared as described in Comparative Example 1, except that the blow ratio was 3.6 to 1.

Comparative Example 2 was torn in several places after stretching, and was not further tested.

EXAMPLE 5

To illustrate surface finish characteristics obtainable with the process of the invention four liquid crystal polymer films were prepared as described in Example 1, except that for one film nonporous polyimide membranes were used as support membranes, and for the remaining three remaining films porous expanded polytetrafluoroethylene films having nominal pore sizes of 1.0, 0.5, and 0.2 micrometers were used as support membranes. Samples of each of the liquid crystal polymer films were taken for surface roughness measurements. The surface roughness measurements are shown in Table 2.

Portions of the above four liquid crystal polymer films were then stretched and further processed as described in Example 3. Additional samples of the stretched films were taken for surface roughness measurements. The surface roughness measurements are shown in Table 2.

For comparative purposes, surface roughness measurements of the film of Comparative Example 1 are included in Table 2.

TABLE 1

| Example | Thickness μm | Tears | Surface Layer Separation | Tensile Strength kg/mm² MD | TD |
|---|---|---|---|---|---|
| 1 | 230 | none | no | 22 | 20 |
| 2 | 230 | none | no | 21 | 22 |
| 3 | 25 | none | no | 28 | 27 |
| 4 | 3 | none | no | 32 | 32 |
| Comp. Ex. 1 | 25 | none | yes | 23 | 23 |
| Comp. Ex. 2 | — | several | — | — | — |

TABLE 2

| | Support Film | Surface Roughness Ra (μm) |
|---|---|---|
| unstretched | -polyimide | 0.06 |
| | -porous PTFE (1.0 μm) | 0.37 |
| | -porous PTFE (0.5 μm) | 0.23 |
| | -porous PTFE (0.2 μm) | 0.15 |
| stretched | -polyimide | 0.03 |
| | -porous PTFE (1.0 μm) | 0.15 |
| | -porous PTFE (0.5 μm) | 0.09 |
| | -porous PTFE (0.2 μm) | 0.07 |
| Comparative Example 1 | | 2.4 |

I claim:

1. A method for manufacturing a liquid crystal polymer film comprising the steps of:

(a) feeding a thermotropic liquid crystal polymer material into a melt region formed between opposed inward-facing surfaces of two support membranes, each support membrane, in the melt region, having an outward-facing surface in contact with the surface of a heated roll, said heated rolls spaced apart to form an opening between the rolls and a gap between said support membranes passing over said rolls;

(b) heating and maintaining said liquid crystal polymer material at a temperature at or above its melt point and accumulating sufficient liquid crystal polymer material in the melt region above said gap to form a reservoir of melted liquid crystal polymer material wherein said liquid crystal polymer becomes randomly oriented;

(c) passing said support membranes and liquid crystal polymer material through said opening between said rolls to form a sandwich structure comprising a liquid crystal polymer film between said support membranes, the width of said opening adjusted to preserve the random orientation of said liquid crystal polymer material forming said liquid crystal polymer film;

(d) solidifying said liquid crystal polymer film.

2. The method for manufacturing a liquid crystal polymer film as recited in claim 1 further comprising the step of removing the support membrane from one or both surfaces of the liquid crystal polymer film.

3. The method for manufacturing a liquid crystal polymer film as recited in claim 1 further comprising the step of providing as at least one of the support membranes, a nonporous membrane.

4. The method for manufacturing a liquid crystal polymer film as recited in claim 1 further comprising the step of providing as at least one of the support membranes, a porous membrane.

5. The method for manufacturing a liquid crystal polymer film as recited in claim 4 further comprising the step of providing as at least one of the support membranes, a porous polytetrafluoroethylene membrane.

6. A method for manufacturing a liquid crystal polymer film comprising the steps of:

(a) feeding a thermotropic liquid crystal polymer material into a melt region formed between opposed inward-facing surfaces of two support membranes, each support membrane, in the melt region, having an outward-facing surface in contact with the surface of a heated roll, said heated rolls spaced apart to form an opening between the rolls and a gap between said support membranes passing over said rolls;

(b) heating and maintaining said liquid crystal polymer material at a temperature at or above its melt point and accumulating sufficient liquid crystal polymer material in the melt region above said gap to form a reservoir of melted liquid crystal polymer material wherein said liquid crystal polymer becomes randomly oriented;

(c) passing said support membranes and liquid crystal polymer material through said opening between said rolls to form a sandwich structure comprising a liquid crystal polymer film between said support membranes, the width of said opening adjusted to preserve the random orientation of said liquid crystal polymer material forming said liquid crystal polymer film;

(d) stretching said sandwich structure in at least one direction, at a temperature at or above the melt point of the liquid crystal polymer, thereby imparting multiaxial orientation to the liquid crystal polymer film; and (e) solidifying said liquid crystal polymer film.

7. The method for manufacturing a liquid crystal polymer film as recited in claim 6 further comprising the step of stretching said sandwich structure in at least two directions, at a temperature at or above the melt point of the liquid crystal polymer, thereby imparting multiaxial orientation to the liquid crystal polymer film.

8. The method for manufacturing a liquid crystal polymer film as recited in claim 6 further comprising the step of solidifying the liquid crystal polymer film before stretching the sandwich structure.

9. The method for manufacturing a liquid crystal polymer film as recited in claim 6 further comprising the step of removing the support membrane from one or both surfaces of the liquid crystal polymer film.

10. The method for manufacturing a liquid crystal polymer film as recited in claim 6 further comprising the step of providing as at least one of the support membranes, a nonporous membrane.

11. The method for manufacturing a liquid crystal polymer film as recited in claim 6 further comprising the step of providing as at least one of the support membranes, a porous membrane.

12. The method for manufacturing a liquid crystal polymer film as recited in claim 11 further comprising the step of providing as at least one of the support membranes, a porous polytetrafluoroethylene membrane.

* * * * *